(12) United States Patent
Amelung et al.

(10) Patent No.: US 9,349,973 B2
(45) Date of Patent: May 24, 2016

(54) LIGHTING MODULE WITH OPTIMIZED CONTACTING

(71) Applicant: TRIDONIC GMBH & CO. KG, Dornbirn (AT)

(72) Inventors: Joerg Amelung, Dresden (DE); Michael Eritt, Dresden (DE); Christian Kirchhof, Dresden (DE)

(73) Assignee: TRIDONIC GMBH & CO. KG, Dornbirn (AT)

( * ) Notice: Subject to any disclaimer, the term of this patent is extended or adjusted under 35 U.S.C. 154(b) by 0 days.

(21) Appl. No.: 14/439,142

(22) PCT Filed: Oct. 29, 2013

(86) PCT No.: PCT/EP2013/072555
§ 371 (c)(1),
(2) Date: Apr. 28, 2015

(87) PCT Pub. No.: WO2014/067919
PCT Pub. Date: May 8, 2014

(65) Prior Publication Data
US 2015/0287944 A1 Oct. 8, 2015

(30) Foreign Application Priority Data
Oct. 29, 2012 (DE) .......................... 10 2012 219 712

(51) Int. Cl.
*H01L 29/06* (2006.01)
*H01L 29/12* (2006.01)
*H01L 31/072* (2012.01)
*H01L 31/109* (2006.01)
*H01L 31/0336* (2006.01)
(Continued)

(52) U.S. Cl.
CPC .............. *H01L 51/445* (2013.01); *H01L 51/52* (2013.01); *H01L 51/5209* (2013.01); *H01L 51/5212* (2013.01); *H01L 51/5225* (2013.01); *H01L51/5228* (2013.01); *H01L 51/5234* (2013.01); *H01L 2251/5361* (2013.01); *Y02E 10/549* (2013.01)

(58) Field of Classification Search
CPC ....... H01L 29/06; H01L 29/12; H01L 31/072; H01L 31/109; H01L 33/0336; H01L 33/32; H01L 33/06; H01L 33/0072; H01L 31/042
USPC ................................................ 257/13; 438/66
See application file for complete search history.

(56) References Cited

U.S. PATENT DOCUMENTS 5,859,397 A * 1/1999 Ichinose ........... H01L 31/03921
204/157.15
6,140,766 A 10/2000 Okada et al.
(Continued)

FOREIGN PATENT DOCUMENTS

EP 2355199 8/2011
WO 2009115955 9/2009
WO 2012052886 4/2012

OTHER PUBLICATIONS

International Search Report for PCT/EP2013/072555, English translation attached to original, Both completed by the European Patent Office on Jan. 8, 2014, All together 5 Pages.

*Primary Examiner* — Phuc Dang
(74) *Attorney, Agent, or Firm* — Brooks Kushman P.C.

(57) ABSTRACT

A lighting module or an organic solar cell, including two plate-type electrodes and an active material located between the two electrodes. In the module, one of the two electrodes includes a transparent material and is provided with a grid structure with at least one metallic conductor track running on the surface or in the material of the electrode, only some sections of the conductor track being connected to the electrode material.

7 Claims, 4 Drawing Sheets

(51) Int. Cl.
*H01L 51/44* (2006.01)
*H01L 51/52* (2006.01)

(56) References Cited

U.S. PATENT DOCUMENTS

2009/0160320 A1* 6/2009 Borner ............... H01L 51/5206
 313/504
2010/0109513 A1* 5/2010 Eser .................... H01L 51/5228
 313/504
2011/0247688 A1* 10/2011 Yoon ............... H01L 31/022433
 136/256
2013/0126853 A1* 5/2013 Nakamura ............. H01L 33/36
 257/40
2013/0192672 A1* 8/2013 Ahn .................... H01G 9/2081
 136/256

* cited by examiner

LIGHTING MODULE WITH OPTIMIZED CONTACTING

CROSS-REFERENCE TO RELATED APPLICATION

This application is the U.S. national phase of PCT Application No. PCT/EP2013/072555 filed on Oct. 29, 2013, which claims priority to DE Patent Application No. 10 2012 219 712.5 filed on Oct. 29, 2012, the disclosures of which are incorporated in their entirety by reference herein.

The present invention relates to a lighting module in accordance with the preamble of claim 1 which has two plate-shaped electrodes and an active material arranged between the two electrodes. In particular, the lighting module can be an OLED (organic light-emitting diode) structure or a QLED (quantum-dot light-emitting diode) structure. In addition, the present invention relates to a so-called organic solar cell.

The development of novel light sources which can replace conventional light sources such as incandescent bulbs or fluorescent lamps owing to their improved properties has made significant advances in recent times. In addition to conventional light-emitting diodes (LEDs) on a semiconductor basis which are substantially punctiform light sources, in particular also OLEDs or QLEDs have taken center stage since novel flat light elements can be implemented on the basis of such structures. As a flat light-emitting element having a luminance which is moderate in comparison with a conventional LED, an OLED or QLED is ideally suited for the production of flat diffuse light sources. The use possibilities for such light sources are extremely varied, and therefore considerable development has taken place in this field in recent years. Owing to its design, an OLED or QLED has the properties of a so-called Lambertian source having a constant luminance at any desired emission angles. Correspondingly, it is particularly well suited for forming large-area light sources.

Organic light-emitting diodes, in the same way as organic solar cells, are likewise so-called thin-film components. Generally, very thin layers are in this case arranged on a glass carrier, the so-called substrate, wherein the individual layers can in this case only be a few nanometers thick. In the case of an organic LED, for example, two electrode layers are provided, with one or more layers of organic material being arranged between said electrode layers. When a voltage is applied between the two electrode layers, the organic material emits light, which is then intended to be emitted over the area of the arrangement. This necessarily means that one of the two electrode layers, generally that which is arranged on the glass carrier, needs to be transparent. In order to form such a transparent electrode, a transparent conductive oxide (TCO), for example indium-tin-oxide (ITO), is usually used.

Structures of this type are so-called current-driven components, i.e. light is generated by the application of a voltage to the two electrode layers in the organic material. In order to achieve a uniform and efficient light emission, correspondingly a homogeneous current distribution over the entire area of the element is desirable. However, this presents a problem insofar as the abovementioned materials for realizing transparent electrodes are in principle current-conducting, but have a comparatively low conductivity. This means that only a very limited degree of homogeneity in the case of a current flow and therefore during generation of light can be achieved by the use of corresponding materials alone.

In order to improve the poor conductivity of the transparent electrode, usually an additional structured metal layer is applied to the transparent electrode. This layer generally consists of a plurality of tracks, which form a so-called grid structure and have a much higher conductivity than the material of the transparent electrode. As a result, the current flow can be improved over the area since the metal tracks act as bypass for the current flow. Contact is made in this case with this metal layer or grid structure on the longitudinal or end side of the arrangement in order that current can be introduced into the electrode layer over the entire length of the structure. In this case, an electrical equilibrium of the current flow forms, although this is not linear over the entire area. Instead, areas with increased current density form, which in turn counteracts the homogenization of the light emission since an increased current density is equivalent to a locally increased light generation.

A comparable problem also results in the organic solar cells already mentioned. In this case too, organic material is arranged between two plate-shaped electrode layers, wherein this organic material now converts incident light into charge carriers, which ultimately effect a current flow between the two electrodes. In turn, at least one electrode needs to be light-transmissive and correspondingly in turn consists of the abovementioned materials, which have a comparatively low conductivity. Even in the case of such organic solar cells, grid structures which again until now have only effected a homogeneous current flow over the entire area to a certain extent, however, are used accordingly.

The present invention is therefore based on the object of proposing an improvement to the solutions known to date, with which further improved homogenization of the current flow over the area of such a lighting module or an organic solar cell can be achieved.

The object is achieved by a lighting module or an organic solar cell having the features of claim 1. Advantageous developments of the invention are the subject matter of the dependent claims.

The solution according to the invention is based on the concept of configuring the grid-forming conductor tracks or coupling the grid-forming conductor tracks to the material of the transparent electrode such that said conductor tracks are connected to the electrode material only in sections. In other words, the conductor tracks are separated from the electrode material over certain sections, which results in the possibility of avoiding the imbalances resulting in the previously known solutions when the current is coupled in. The solution according to the invention in this case in particular is characterized by the fact that the previously known technologies for constructing QLEDs or OLEDs or organic solar cells can be used, and an optimized, and therefore more uniform current flow without a high level of additional complexity can be achieved.

In accordance with the invention, therefore, a lighting module or an organic solar cell is proposed which has two plate-shaped electrodes and an active material arranged between the electrodes. One of the two electrodes in this case consists of a transparent material and is additionally provided with a grid structure, which has at least one metallic conductor track, which runs on the surface or in the material of the transparent electrode. In accordance with the invention, the conductor track is connected to the electrode material only in sections.

In accordance with an advantageous development, provision can be made in particular for the conductor track of the grid structure to extend from a lateral connection region of the electrode into a more central region, wherein that section of the conductor track which is closer to the connection region is separated from the electrode material. As an alternative or in addition to this, the end region of the conductor track can also be separated from the electrode material so that there is only a connection in a central region of the conductor track. Preferably, the grid has a plurality of conductor tracks which are arranged in the form of a grid, for example, and extend in parallel lines over the area of the lighting module or the organic solar cell.

The separation of the conductor tracks from the electrode material over certain sections can in this case take place in particular by virtue of the fact that notches are provided in the plate-shaped electrode material. This can take place in a simple manner with the aid of a laser or else in a conventional manner, for example using lithography, so that the complexity for realizing the solution according to the invention is therefore extremely low.

The lighting module according to the invention may be an organic LED or a QLED, as previously mentioned. The coupling in accordance with the invention between the grid structure and the transparent electrode has an advantageous effect even in the case of organic solar cells, however, as already mentioned.

The invention will be explained in more detail below with reference to the attached drawing, in which.

Figure 1:
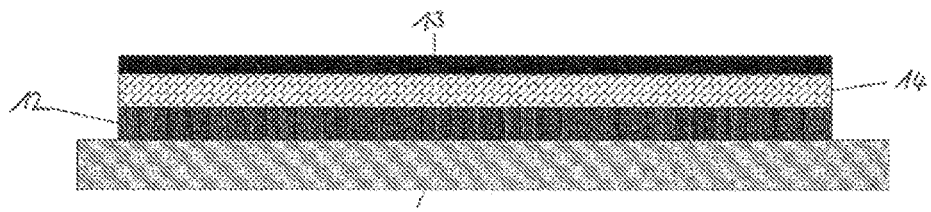
FIGS. 1 and 2 show schematic illustrations of an OLED structure known from the prior art without a metal grid.
Figure 2:
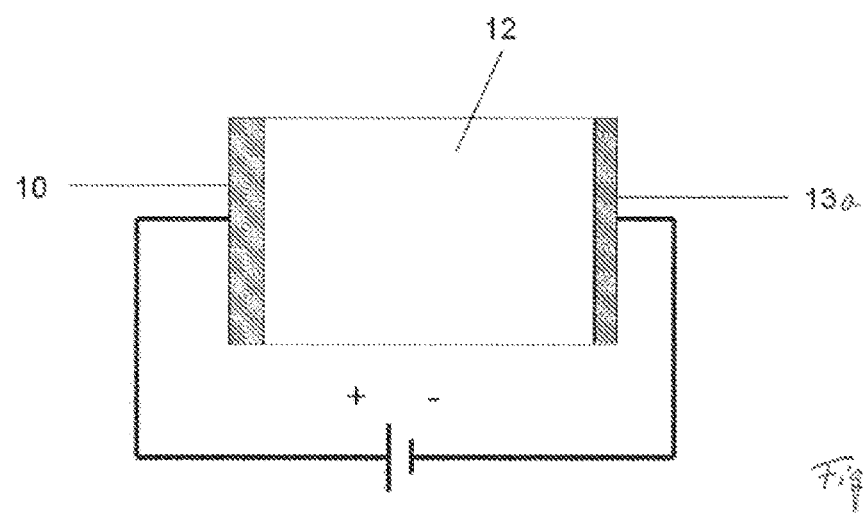

The problem on which the invention is based will be explained initially with reference to FIGS. 1 to 3. FIGS. 1 and 2 in this case show a sectional illustration and a plan view, respectively, of a conventional organic LED known from the prior art, in which case initially no additional metal grid is used for improving the uniform current flow.

Corresponding to the sectional illustration shown in FIG. 1, the conventional design of an OLED or QLED consists in that a layer arrangement consisting of two electrodes 12 and 13 is arranged on a carrier substrate 5, which is generally formed by a glass plate, wherein an active material 14 is located between the two electrodes 12, 13. In the case of an OLED, this active material 14 consists of one or more layers of organic material, which are such that, when a voltage is applied between the two electrodes 12 and 13, light is generated. This light is generally emitted via the lower electrode layer 12 and the carrier substrate 5, which means that the electrode 12 necessarily needs to be transparent. Said electrode correspondingly generally consists of a transparent conductive oxide (TCO), wherein generally indium-tin-oxide (ITO) is used.

The design of an organic solar cell is in principle identical. In this case too, generally two electrodes are arranged on a transparent carrier substrate, with organic material being located between said electrodes. In the case of a solar cell, the organic material is in particular two layers which form a so-called electron donor and an electron acceptor. In the case of incident light in this region, charge carriers are generated, which then ensure a current flow between the two electrode layers. In this case too, it is necessary for one of the two electrodes to be transmissive to light or transparent for efficient incidence of light, which in turn means that the above-mentioned transparent conductive materials are used.

A view of the lower side of the OLED structure from FIG. 1 is shown in FIG. 2, in which case there is no illustration of the carrier substrate. What can be seen here is the flat transparent electrode layer 12, which is electrically connected laterally via a contact 10 extending over the entire width of the structure. On the opposite side, the connection 13a for the electrode 13 is illustrated, which has no further relevance for the present invention, however. In general, the upper electrode 13 consists of a thin metal layer which, owing to its high conductivity, does not represent any problems in respect of the uniformity of the current flow through the arrangement when viewed over the area thereof.

If a voltage is applied in the case of the arrangement shown in FIG. 2 in order to achieve a current flow through the organic material and to correspondingly generate light, no uniform current flow over the area results owing to the low conductivity of the material for the transparent electrode 12. Instead, much higher current densities are present in the region close to the connection 10, while virtually no current flows any more at the opposite end region of the arrangement, on the other hand. This means that, when viewed over the area of the lighting module, light is generated and emitted nonuniformly.

Figure 3:
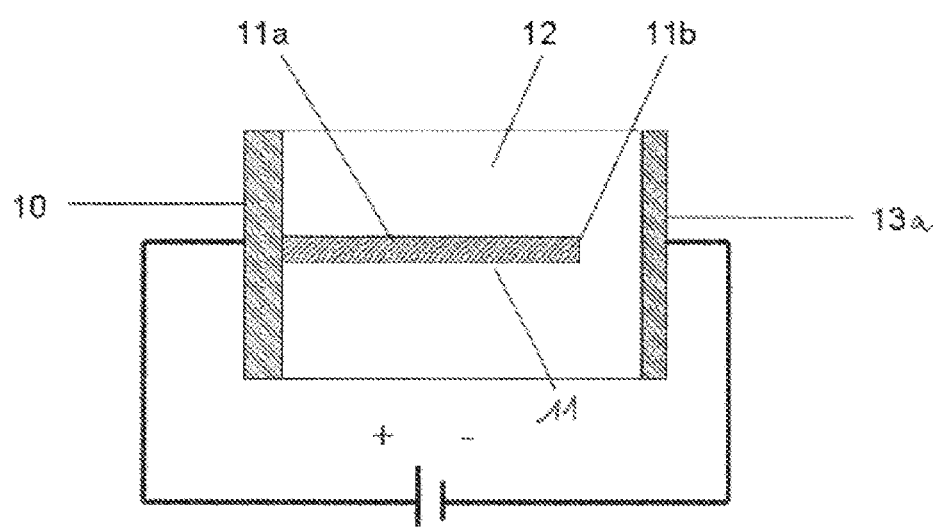
FIG. 3 shows the plan view of an OLED structure known from the prior art in which a metal grid is used for improving the current flow.

The solution illustrated in FIG. 3, in which the electrode 12 is additionally provided with a grid structure, is therefore known from the prior art for improving the current flow. In the exemplary embodiment illustrated, the grid structure merely consists of a track 11, which is formed by a metallic conductor having a high conductivity, which is connected directly to the lateral connection 10 and is coupled, over its length, conductively to the electrode material. The use of this grid structure means that the current flow is distributed over the area of the electrode 12 more effectively. Since, however, the current is distributed over the entire length of the conductor track, the effect also occurs here whereby there is virtually no or only a low level of current flow at the end region 11b of the conductor track 11, while in turn higher current intensities are present in the region 11a directly adjoining the contact 10, on the other hand. As before, therefore, no optimum uniform current distribution over the entire area of the electrode 12 can be achieved here either, even if there are already certain improvements, for example of the variant in FIGS. 1 and 2 in which no metal grid is used.

With the solution according to the invention, the current distribution over the entire area is markedly improved. This is achieved according to the invention by virtue of the fact that an electrical connection of the metal grid to the electrode material takes place only in sections. This concept will be explained below first in principle with reference to FIGS. 4 to 6.

Figure 4:
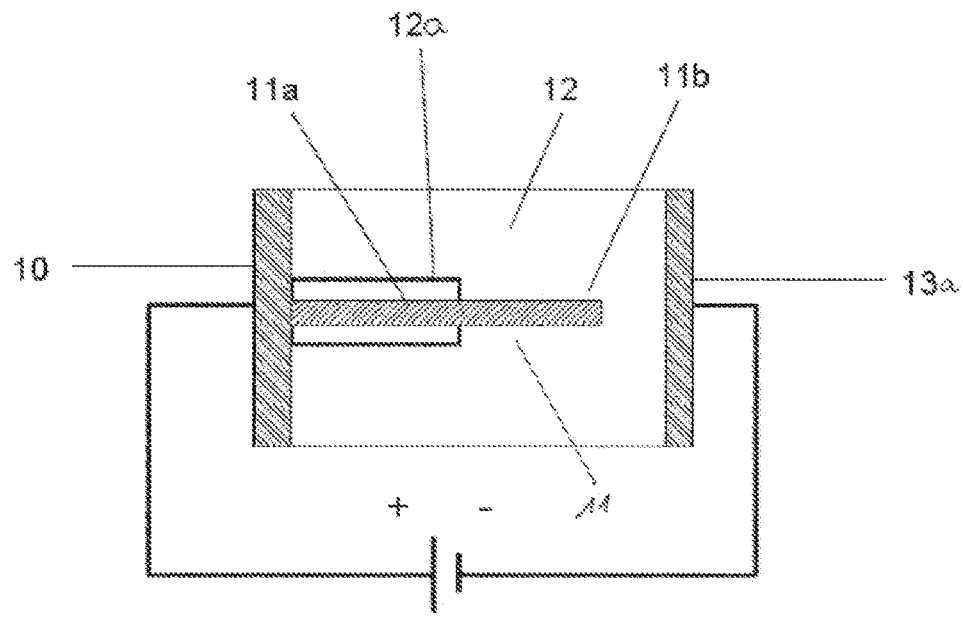
FIG. 4 shows a first variant according to the invention for sectional coupling between the transparent electrode and the metal grid.

A first conceivable embodiment of the invention is illustrated in FIG. 4. In this case, provision is made for the conductor track 11 of the metal grid to be connected to the material of the electrode 12 only in a region 11b which is further remote from the connection 10. That region 11a which is close to the connection 10, on the other hand, is separated from the electrode material, which is achieved with the aid of a separation 12a or division of the electrode material, as described in more detail further below. In this case, therefore, current is first distributed in the further remote region 11b of the conductor track 11 over the area of the electrode 12 with the aid of the grid.

The effect of the grid in the exemplary embodiment illustrated is correspondingly restricted to regions of the electrode 12 which are further remote from the connection 10. The regions of the electrode 12 which are closer to the connection 10, on the other hand, receive current directly via this connection 10. Then, a corresponding adjustment with respect to the effect of the metal grid can be performed from the ratio of the length of the conductor track 11 and the region 11a, which is not coupled directly to the electrode 12. Therefore, the luminance of the structure can be influenced in a targeted manner, wherein in particular there is of course the possibility of compensating for inhomogeneities and achieving a homogeneous light emission over the entire area.

Figure 5:
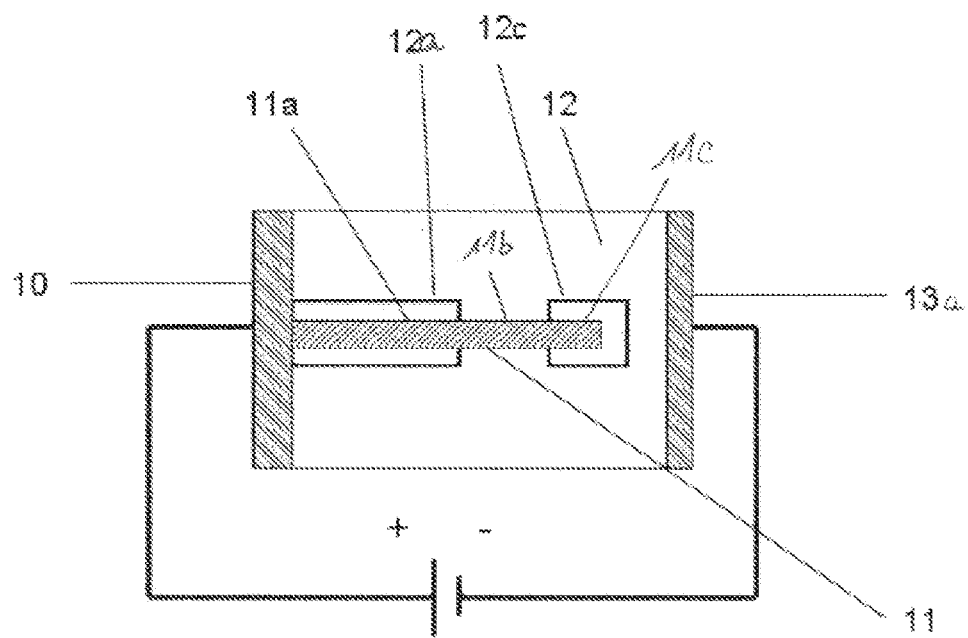
FIG. 5 shows a second variant according to the invention.

A development of the concept from FIG. 4 is illustrated in FIG. 5, wherein identical elements have been provided with the same reference symbols. In this case, the terminating end region 11c of the conductor track 11 is also separated from the electrode material 12 owing to separation or isolation 12c, so that only a connection between the conductor track 11 and the electrode 12 is present in the central region 11b. This example illustrates the fact that there is the possibility of performing coupling between the grid structure and the electrode material in a targeted manner only over certain sections.

Figure 6:
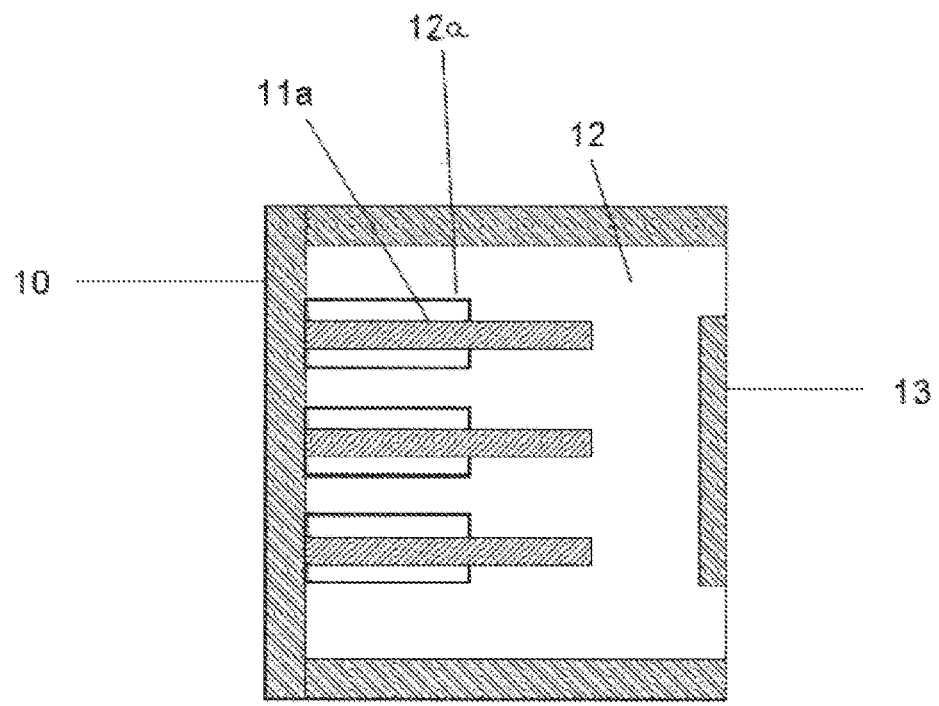
FIG. 6 shows a third variant according to the invention.

The coupling of the metal grid to the electrode 12 can in this case be configured in any desired complex manner in order to adjust the current flow optimally over the entire area of the electrode 12. With the aid of electrical calculations or simulations, in this case an optimum structure for each area can be found, wherein a further conceivable possibility is illustrated in FIG. 6. In this case, the grid consists of a plurality of conductor tracks 11, which run parallel to one another and which again are coupled to the electrode material only in their regions which are further remote from the connection 10, however. Such a grid structure generally represents the optimum shape for a grid in order to achieve a uniform current flow over the entire area. This is additionally optimized by the only sectional coupling between the grid structure and the electrode material according to the invention.

The only sectional coupling of the grid structure to the transparent electrode can take place in different ways. Two preferred variants for this will be explained below, which are distinguished in that the complexity associated therewith is comparatively low and in particular existing technologies for producing OLEDs can be used. These variants in this case primarily differ in terms of the way in which the metal grid is integrated in the arrangement.

During the production process, in this case generally initially the transparent electrode 12 is structured since it defines the later region of the light-emitting area of the OLED. Likewise, the metalizations for the contacts of the electrodes are structured. In respect of the arrangement or production of the metal grid, there are essentially two variants, wherein the conductor tracks of the grid are arranged either below the transparent layer or in the electrode material or above this.

Figure 7A:
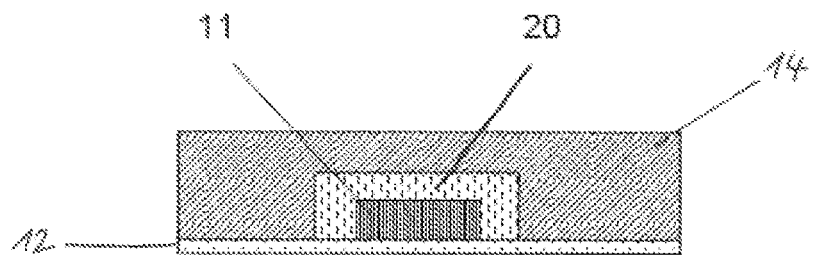
FIGS. 7a and 7b show a first possibility for sectional coupling and separation of the metal grid and electrode, respectively.

FIG. 7a in this case first shows a variant in which the conductor track 11 is arranged above the electrode 12. In order to avoid local high current densities, in this case the conductor track 11 is "passivated" by a nonconductive material 20. This nonconductive material 20 therefore separates the conductor track 11 from the surrounding organic material 14 or prevents direct contact between the conductor track 11 and organic material 14, but nevertheless does of course permit a connection between the conductor track 11 and the electrode 12. During production, therefore, first the conductor track 11 and then the nonconductive material 20 are applied to the electrode 12. Then, the application of the organic material 14 takes place.

Figure 7B:
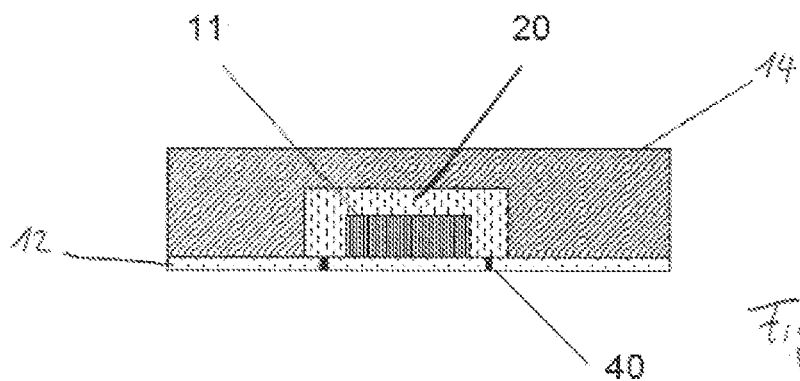

In order now to perform coupling between the conductor track 11 and the electrode 12 only in sections corresponding to the present invention, separation of the electrode material below the corresponding region only needs to be performed in those regions in which a direct connection between the conductor track 11 and the electrode 12 is not desired, as is shown in FIG. 7b. Such separations or notches 40 can be provided in a simple manner by virtue of etching processes or laser ablation or other suitable methods without this being associated with a great deal of complexity.

Figure 8A:
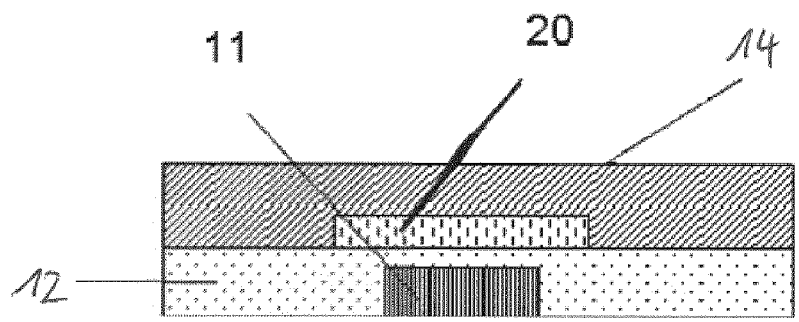
FIGS. 8a and 8b show a second variant for sectional coupling and separation of the metal grid and electrode, respectively.
Figure 8B:
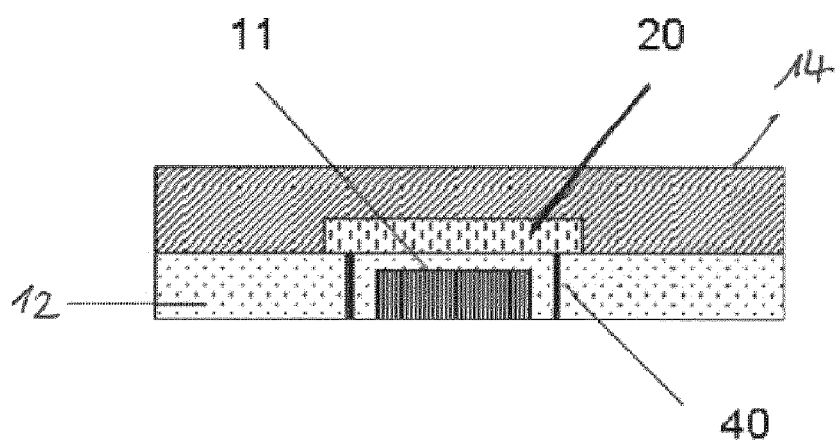

In a second variant, the conductor track is arranged below the transparent electrode 12 or is embedded therein, as illustrated in FIG. 8b. Generally, this is achieved by virtue of the fact that first a grid structure is arranged on the glass substrate 5 illustrated in FIG. 1, and then the material of the transparent electrode 12 is deposited. In order in turn to achieve only sectional coupling between the grid structure or conductor track 11 and the electrode 12 in accordance with the invention, in this case too notches 40 are then introduced into the electrode material in the corresponding regions in order to achieve the desired division or separation. Then, in turn passivation takes place from suitable, i.e. insulating material 20 in the region above the conductor track 11 and final application of the organic material 14 takes place.

In the two variants illustrated, therefore, the solution according to the invention can be realized in a very simple manner. It is advantageous here in particular that the sectional coupling between the metal grid and the electrode material can be achieved by very simple measures and in particular the application of additional layers or the like is not required. Nevertheless, even very complex systems which can be varied freely in terms of their length, shape and position of the structures can be realized in this case.

With the aid of the present invention, therefore, the efficiency of flat lighting modules, in particular of OLEDs or QLEDs, can be markedly increased in a comparatively simple manner. Organic solar cells can also be improved in terms of their efficiency with the aid of the sectional coupling between the grid structure and the electrode material.

The invention claimed is:

1. A lighting module or an organic solar cell, comprising: two plate-shaped electrodes and an active material arranged between the two electrodes, wherein one of the two electrodes consists of a transparent material and is provided with a grid structure, which has at least one metallic conductor track, which runs along a surface of or in the transparent material of the electrode, wherein the metallic conductor track is connected to the transparent electrode material only in sections and the other sections of the metallic conductor track are separated from the transparent electrode material.

2. The lighting module or the organic solar cell as claimed in claim 1, wherein the metallic conductor track of the grid structure extends from a lateral connection region of the electrode into a central region, wherein that section of the metallic conductor track which is closer to the connection region is separated from the transparent electrode material.

3. The lighting module or the organic solar cell as claimed in claim 1, wherein end region of the metallic conductor track is separated from the transparent electrode material.

4. The lighting module or the organic solar cell as claimed in claim 1, wherein isolation between the metallic conductor track and transparent electrode material is performed by virtue of notches in the transparent electrode material.

5. The lighting module or the organic solar cell as claimed in claim 1, wherein the grid structure has a plurality of metallic conductor tracks running parallel to one another.

6. The lighting module or the organic solar cell as claimed in claim 1, wherein the active material is an organic material.

7. The lighting module as claimed in claim 6, wherein said lighting module is an OLED or QLED.

\* \* \* \* \*